(12) United States Patent
Seki (10) Patent No.: US 6,714,031 B2
(45) Date of Patent: Mar. 30, 2004

(54) SEMICONDUCTOR DEVICE FOR WAFER EXAMINATION

(75) Inventor: Hiroshi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 16 days.

(21) Appl. No.: 10/151,246

(22) Filed: May 21, 2002

(65) Prior Publication Data

US 2002/0179903 A1 Dec. 5, 2002

(30) Foreign Application Priority Data

May 31, 2001 (JP) ........................ 2001-164775

(51) Int. Cl.$^7$ ..................... G01R 31/02; G01R 1/04
(52) U.S. Cl. ................. 324/763; 324/73.1; 324/158.1
(58) Field of Search ................. 324/763, 765, 324/158.1, 73.1; 257/48, 207–211, 619, 620, 622

(56) References Cited

U.S. PATENT DOCUMENTS

| | | | | |
|---|---|---|---|---|
| 5,059,899 A | * | 10/1991 | Farnworth et al. | 324/73.1 |
| 5,477,062 A | * | 12/1995 | Natsume | 257/48 |
| 5,523,252 A | * | 6/1996 | Saito | 324/765 |
| 5,654,582 A | * | 8/1997 | Kijima et al. | 257/620 |
| 6,020,618 A | * | 2/2000 | Sakai | 257/419 |
| 6,320,242 B1 | * | 11/2001 | Takasu et al. | 257/529 |
| 6,400,173 B1 | * | 6/2002 | Shimizu et al. | 324/765 |
| 6,404,217 B1 | * | 6/2002 | Gordon | 324/765 |

OTHER PUBLICATIONS

U.S. patent application Ser. No. 09/971,921, Seki, filed Oct. 9, 2001.

* cited by examiner

*Primary Examiner*—Ernest Karlsen
*Assistant Examiner*—Jermele M. Hollington
(74) *Attorney, Agent, or Firm*—Oliff & Berridge, PLC (57) ABSTRACT

The invention provides a semiconductor device that enables examination of a wafer in an initial stage to check whether the wafer is acceptable or defective in the case of DC examinations for circuit elements and also AC examinations for circuit delay times and the like. A semiconductor device is equipped with (a) a semiconductor wafer including a plurality of chip regions in which a required circuit is formed, and a scribe region to divide the plurality of chip regions, (b) a test circuit for wafer examination formed in the scribe region and formed of a plurality of transistors, and (c) an output pad formed in the scribe region and connected to the test circuit.

7 Claims, 6 Drawing Sheets

SEMICONDUCTOR DEVICE FOR WAFER EXAMINATION

BACKGROUND OF THE INVENTION

1. Field of Invention

The present invention generally relates to semiconductor devices, and more particularly, to a semiconductor device in which a TEG (test elementary group) is inserted in a specified region of a wafer to conduct a pass-or-fail test for the wafer.

2. Description of Related Art

Generally, numerous steps are required to manufacture semiconductor devices, and therefore it is desirable to determine, at an initial stage of the process, as to whether a wafer is acceptable or defective, so that defective wafers can be removed from the manufacturing process. For this reason, a TEG (test elementary group), an element for wafer examination, may often be formed in a predetermined region of the wafer.

FIGS. 8(a) and 8(b) are schematics that show a wafer in which such a TEG is formed. The wafer 10 shown in FIG. 8(a) will be cut by dicing into small pieces to provide numerous individual chips 11. For this reason, as FIG. 8(b) shows, dicing lines 12, that serve as marks for the dicing, are drawn between the numerous chip regions. In this manner, regions on the wafer that divide the chip regions can be used for drawing marks or the like, and are therefore referred to as scribe regions. As shown in FIG. 8(b), the TEG is formed in a predetermined region 13 among the scribe regions. Hereafter, the region where the TEG is formed is referred to as a scribe TEG region.

Figure 9:
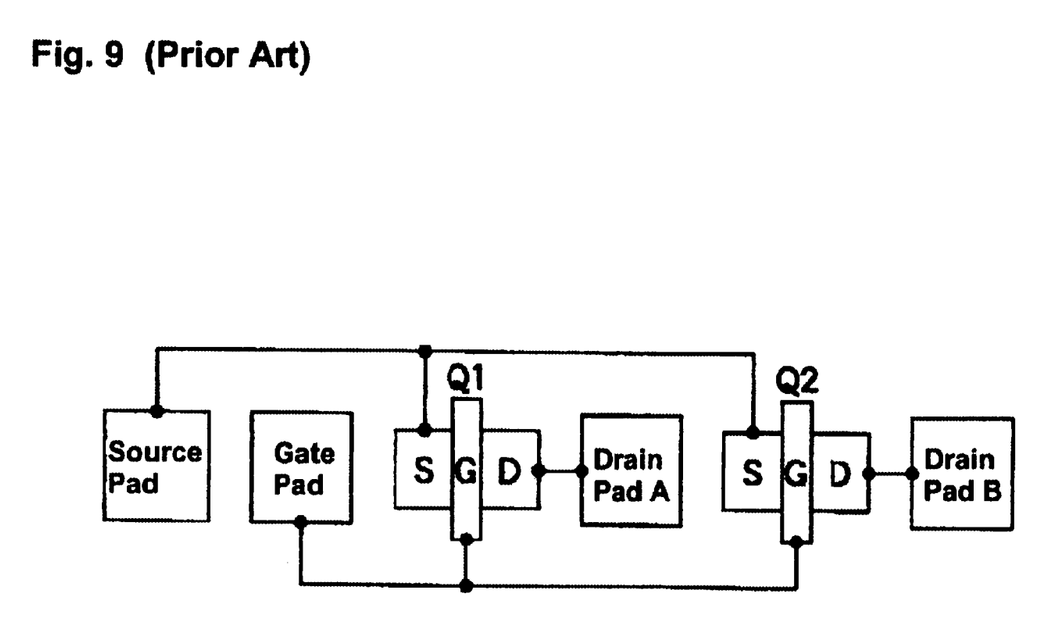
FIG. 9 is a circuit diagram of a related art test circuit that is formed in a scribe TEG region for a semiconductor device.

In the related art, circuit elements, such as transistors, are formed in scribe TEG regions, and characteristics of the circuit elements themselves are measured to judge whether the wafers are acceptable or defective. FIG. 9 shows one example of the circuit element that is formed in a scribe TEG region in the related art semiconductor device.

In FIG. 9, two transistors Q1 and Q2 are shown as an example. Gates G of the transistors Q1 and Q2 are connected to a gate pad, and sources S thereof are connected to a source pad. Also, a drain D of the transistor Q1 is connected to a drain pad A, and a drain D of the transistor Q2 is connected to a drain pad B. Probes, which are connected to a measuring apparatus (IC tester or the like) through cables, are brought into contact with the pads, and characteristics of the transistors Q1 and Q2 are measured. This measurement is referred to as a DC examination in which a DC voltage is applied to the circuit elements, and DC voltage or DC current generated on the circuit elements are measured. A drain current $I_{OFF}$ during an OFF period, a drain current $I_{ON}$ during an ON period, a gain coefficient $\beta$, a gate-source threshold voltage $V_{TH}$ and the like can be listed as characteristics to be measured for the transistors.

A delay time in the circuit that is formed of a combination of multiple transistors in a chip that is actually used substantially changes according to changes in the parasitic capacitance and diffusion resistance in each of the elements. However, measurements of the parasitic capacitance and diffusion resistance of transistors formed in scribe TEG regions are difficult because the floating capacitance and loss resistance affect such measurements. Accordingly, for related art semiconductor devices, it is not possible to completely check, at an initial stage, whether a wafer is acceptable or defective, and an operational defect may then be discovered for the first time when chips are completed. This causes a problem in that the yield of chips is lowered in later manufacturing steps.

Also, in order to analyze steps that may have caused such operational defects, the AC examination is necessarily conducted on the completed chips, making the confirmation work more complicated.

SUMMARY OF THE INVENTION

In view of the above, the present invention provides a semiconductor device that enables determination of a wafer, at an initial stage, as to whether the wafer is acceptable or defective in the case of DC examinations for circuit elements and also AC examinations for circuit delay times and the like.

In order to address the problems described above, a semiconductor device in accordance with the present invention is equipped with (a) a semiconductor wafer including a plurality of chip regions in which a specified circuit is formed, and a scribe region to divide the plurality of chip regions, (b) a test circuit for wafer examination formed in the scribe region and formed of a plurality of transistors, and (c) an output pad formed in the scribe region and connected to the test circuit.

The semiconductor device in accordance with the present invention may further include an input pad that is formed in the scribe region and connected to the test circuit. In this case, the test circuit may include a plurality of serially connected inversion circuits. Alternatively, the test circuit may include a selector circuit that supplies a signal supplied from the input pad to a first output or a second output according to a control signal, a plurality of inverter circuits serially connected to a first output of the selector circuit, an output circuit that supplies, to the output pad, one of an output signal of the last stage of the plurality of inverter circuits and a second output signal of the selector circuit, and a control pad formed in the scribe region to input a control signal to the selector circuit. Alternatively, the test circuit may include a plurality of inverter circuits serially connected to the input pad, and an output circuit that produces an exclusive OR of an output signal of the last stage of the plurality of inverter circuits and an input signal supplied to the input pad, and supplies the same to the output pad.

Also, in the semiconductor device in accordance with the present invention, the test circuit may include a plurality of circuits that are connected in a loop, invert an input signal and output the same, and an output circuit that supplies an output signal of one of the plurality of circuits to the output pad. These circuits may include at least one NAND circuit, and the semiconductor device may further include a control pad that is formed in the scribe region to supply a control signal to one of inputs of the at least one NAND circuit.

In the above semiconductor devices, the plurality of transistors formed in the scribe region for wafer examination may include a transistor having the same configuration of a transistor formed in the chip regions. Also, in the case of a gate array, the plurality of transistors formed in the scribe region for wafer examination may form a cell having the same configuration of a basic cell formed in the chip regions.

In accordance with the invention, a test circuit formed of a plurality of transistors for wafer examination is formed in a scribe TEG region. As a result, pass or fail of a wafer can be determined in an initial stage in the case of DC examination for circuit elements and also AC examination for circuit delay times and the like. Also, the same circuit may be formed for different types, such that data can be compared among the different types. Further, the AC examination in each chip may possibly be omitted, which alleviates the burden for analysis in the AC examination.

BRIEF DESCRIPTION OF THE DRAWINGS

FIG. 8($a$) is a schematic that shows a wafer in which TEG is formed, and FIG. 8($b$) is an enlarged schematic of a part of the wafer shown in FIG. 8($a$);

DETAILED DESCRIPTION OF PREFERRED EMBODIMENTS

Embodiments of the present invention will be described with reference to the accompanying drawings.

Figure 8:
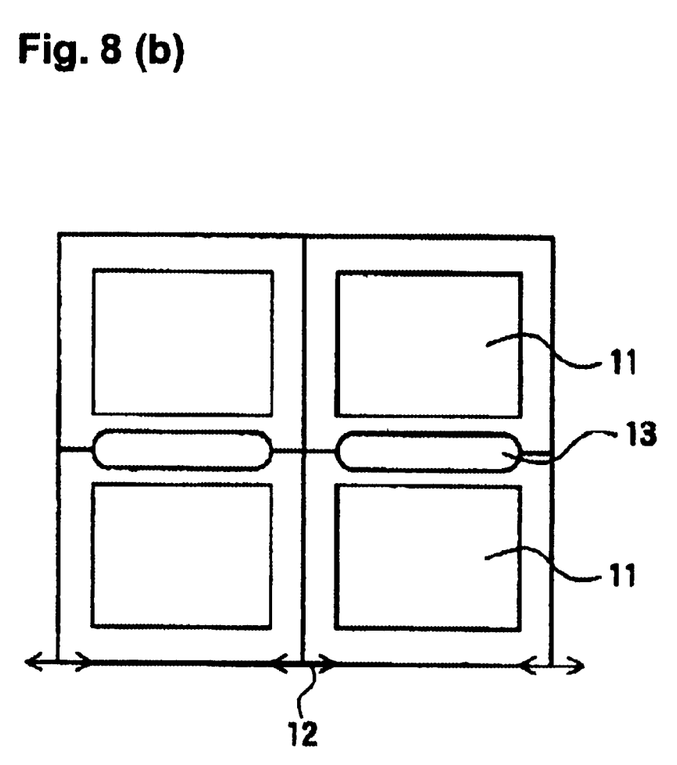

As shown in FIGS. 8($a$) and 8($b$), a semiconductor wafer 10 includes a plurality of chip regions 11 in which a required circuit is formed, and scribe regions that divide the chip regions. A so-called TEG (test elementary group), an element for wafer examination, is formed in a scribe TEG region 13 among the scribe regions. In accordance with the present invention, a plurality of transistors for wafer examination, that are formed in the scribe TEG region, form a test circuit to conduct AC examination. Further, an input pad connected to an input of the test circuit, and an output pad connected to an output of the test circuit, are formed in the scribe region.

First, a first embodiment of the present invention will be described.

Figure 1:
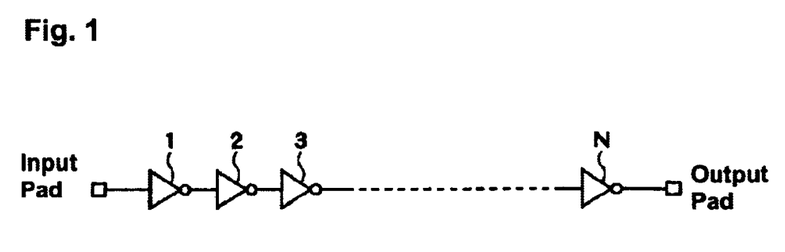
FIG. 1 is a circuit diagram of a test circuit that is formed in a scribe TEG region for a semiconductor device in accordance with a first embodiment of the present invention.

FIG. 1 is a circuit diagram of a test circuit that is formed in the scribe TEG region for a semiconductor device in accordance with the first embodiment of the present invention. As shown in FIG. 1, in the present embodiment, a plurality of serially connected inverter circuits 1–N are formed. Here, "N" is preferably an even number that is 2 or greater.

Generally, each of the inverter circuits is formed from one P-channel transistor and one N-channel transistor. These transistors may preferably be in the same configuration as that of transistors that are formed in the chip regions. Also, in the case of a gate array, the plurality of transistors formed in the scribe TEG region may preferably form a cell having the same configuration as that of a basic cell formed in the chip regions. By doing so, AC examination in each of the chips can be omitted.

An input pad is connected to an input of the inverter circuit 1, and an output pad is connected to an output of the inverter circuit N. In AC examination of a semiconductor wafer, probes connected to a measuring apparatus are brought into contact with these input and output pads, and another probe is brought into contact with a power supply pad to supply a necessary power supply voltage to the test circuit. A test signal is supplied to the input pad, and voltage appearing on the output pad is measured.

Items to be measured include, for example, a delay time of the circuit. As shown in FIG. 1, by serially connecting the plurality of inverter circuits 1 through N, delay times occurring in the respective circuits accumulate. This makes the measurement of delay time easy. As a test signal to measure delay time, for example a step signal that rises from a low level to a high level or a rectangular wave, may be used, and a rising point of the test signal at the input pad and a rising point of the test signal at the output pad may be compared to obtain the delay time in the test circuit.

Next, a second embodiment of the present invention will be described.

Figure 2:
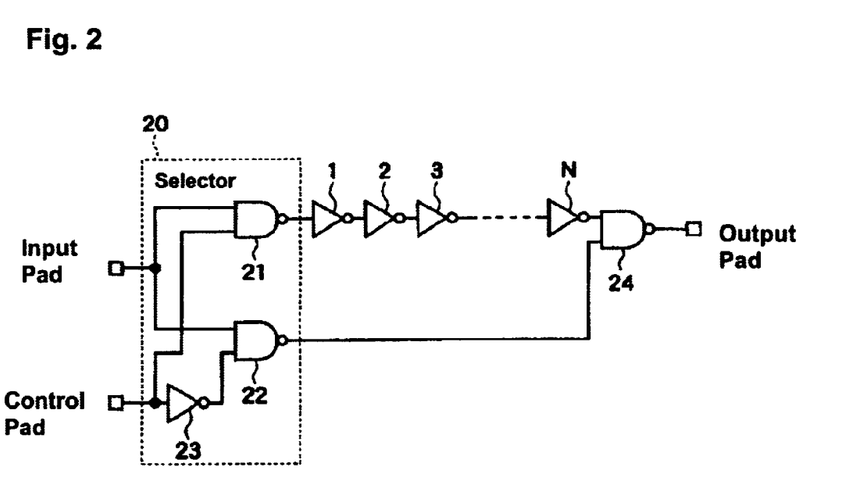
FIG. 2 is a circuit diagram of a test circuit that is formed in a scribe TEG region for a semiconductor device in accordance with a second embodiment of the present invention.
Figure 3:
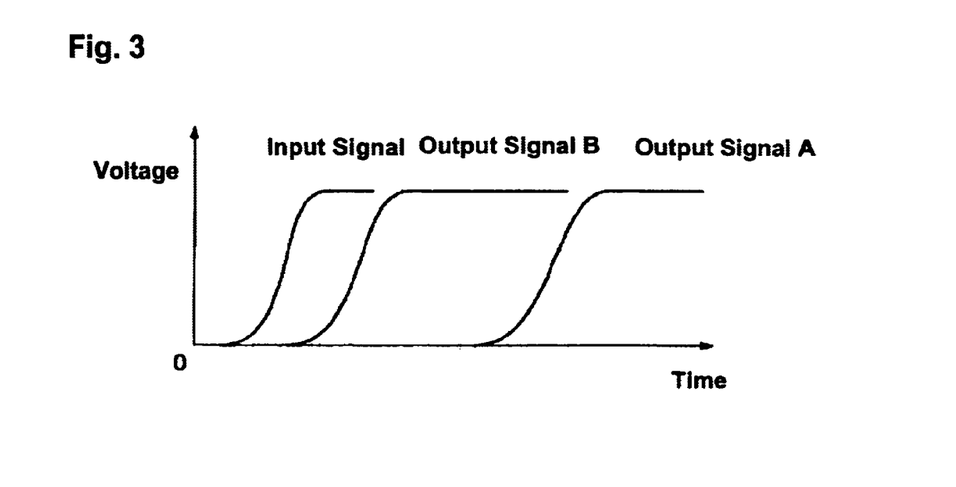
FIG. 3 is a waveform diagram showing timings of input/output signals of the test circuit of FIG. 2.

FIG. 2 is a circuit diagram of a test circuit that is formed in the scribe TEG region for a semiconductor device in accordance with the second embodiment of the present invention. FIG. 3 is a waveform diagram showing timings of input/output signals of the test circuit of FIG. 2. In the present embodiment, in addition to inverter circuits 1–N that are similar to those of the first embodiment, a selector circuit 20 that distributes an input signal, and a NAND circuit 24 as an output circuit, are formed.

As shown in FIG. 2, the selector circuit 20 is formed from two NAND circuits 21 and 22, and an inverter circuit 23. According to a control signal supplied to the control pad, the selector circuit 20 supplies a signal inputted in the input pad either to a first output through the NAND circuit 21 or to a second output through the NAND circuit 22. The first output of the selector circuit 20 connects to the serially connected inverter circuits 1–N. The NAND circuit 24 produces a logical product (inversion) of an output signal of the inverter circuit N and the second output signal of the selector circuit 20, and supplies the same to the output pad.

In AC examination of a semiconductor wafer, a probe connected to a measuring apparatus is brought into contact with the output pad, and a necessary power supply voltage is supplied to a power supply pad. Then, a test signal is supplied to the input pad, and a voltage appearing on the output pad is measured.

When the control signal is at a high level, the output of the inverter circuit 23 changes to be at a low level, and the output of the NAND circuit 22 always remains at a high level. The output of the NAND circuit 21 changes according to the test signal inputted in the input pad. The output of the NAND circuit 21 is delayed by the inverter circuits 1–N, and then supplied to one of the inputs of the NAND circuit 24. The output of the NAND circuit 22 is supplied as is to the other input of the NAND circuit 24. Accordingly, the NAND circuit 24 outputs a test signal (an output signal A in FIG. 3) that has been delayed by the inverter circuits 1–N.

On the other hand, when the control signal is at a low level, the output of the NAND circuit 21 always remains at a high level. The output of the inverter circuit 23 is also at a high level, but the output of the NAND circuit 22 changes according to the test signal inputted to the input pad. The output of the NAND circuit 21 is supplied to one of the inputs of the NAND circuit 24 through the inverter circuits 1–N, and the output of the NAND circuit 22 is supplied as is to the other input of the NAND circuit 24. Therefore, the NAND circuit 24 outputs a test signal (an output signal B in FIG. 3) that has not been delayed by the inverter circuits 1–N. However, this signal is delayed by the NAND circuits 22 and 24.

As shown in FIG. 3, in the test circuit, the output signal B is delayed against an inputted test signal (an input signal) by a delay time caused by the NAND circuits 22 and 24. Further, the output signal A is delayed against the output signal B by a delay time caused by the inverter circuits 1–N. Therefore, by switching the control signal to a high level or to a low level, and comparing the output signal A and the output signal B, a delay time caused by the inverter circuits 1–N can be accurately measured.

In this manner, in accordance with the present embodiment, without measuring a test signal at the input pad, AC examination of the semiconductor wafer can be conducted. Also, without being affected by delays caused by the probes and cables used for the measurement, the delay time can be measured.

Next, a third embodiment of the present invention will be described.

Figure 4:
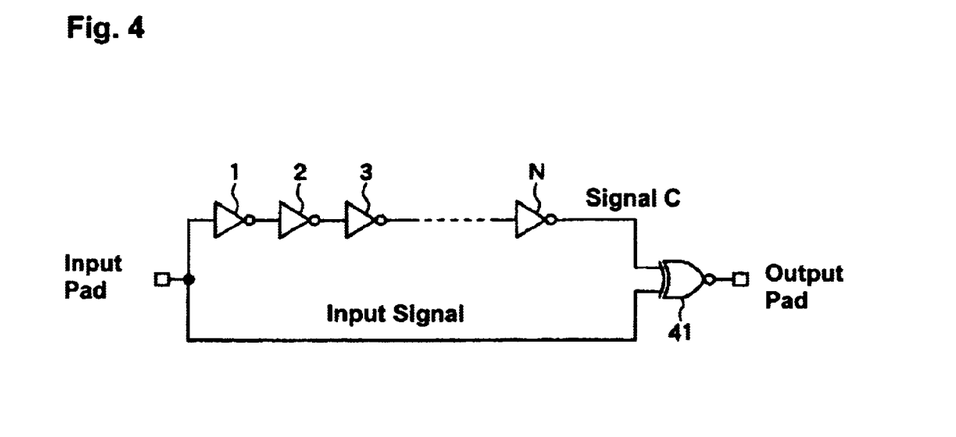
FIG. 4 is a circuit diagram of a test circuit that is formed in a scribe TEG region for a semiconductor device in accordance with a third embodiment of the present invention.
Figure 5:
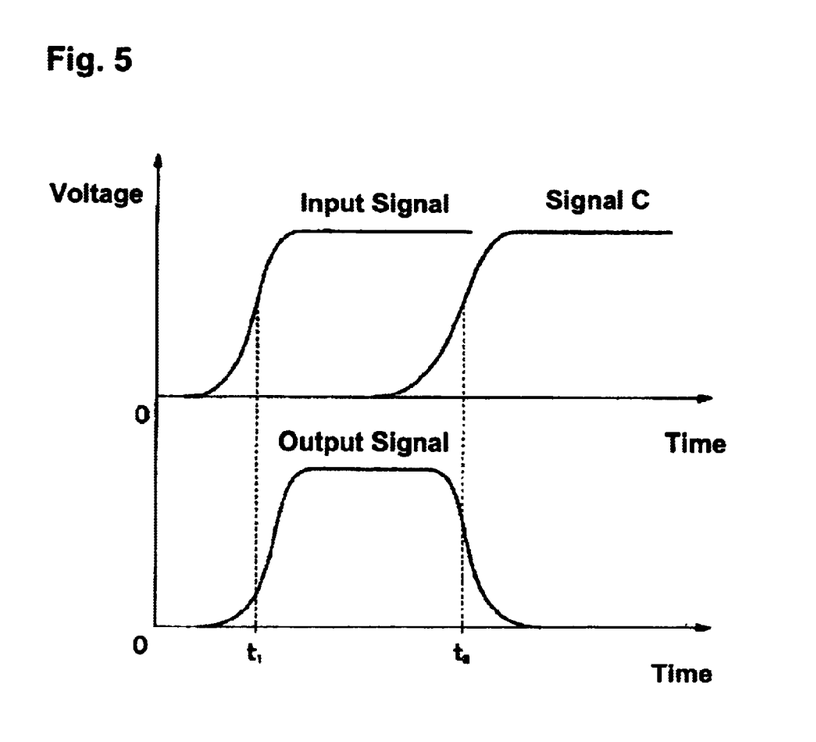
FIG. 5 is a waveform diagram showing timings of input/output signals of the test circuit of FIG. 4.

FIG. 4 is a circuit diagram of a test circuit that is formed in the scribe TEG region for a semiconductor device in accordance with the third embodiment of the present invention. FIG. 5 is a waveform diagram showing timings of input/output signals of the test circuit of FIG. 4. In the present embodiment, in addition to inverter circuits 1–N that are similar to those of the first embodiment, an XNOR circuit (an exclusive NOR circuit) 41 as an output circuit is formed. The XNOR circuit 41 produces an exclusive OR (an inversion) of the output signal C of the inverter circuit N and the inputted test signal (an input signal), and supplies the same to the output pad.

In AC examination of a semiconductor wafer, a probe that is connected to a measuring apparatus is brought into contact with the output pad, and a necessary power supply voltage is supplied to a power supply pad. Then, a test signal is supplied to the input pad, and a voltage appearing on the output pad is measured.

As shown in FIG. 5, as the input signal rises at time t1, the output signal of the XNOR circuit 41 changes to be a high level. Further, when the output signal C of the inverter circuit N rises with a delay at time $t_2$, the output signal of the XNOR circuit 41 changes to be a low level. Accordingly, the period in which the output signal of the XNOR circuit 41 stays at a high level corresponds to a delay time caused by the inverter circuits 1–N.

In this manner, in accordance with the present embodiment, without measuring a test signal at the input pad, or without applying a control signal to the control pad, AC examination of the semiconductor wafer can be conducted. Also, without being affected by delays caused by the probes and cables used for the measurement, delay times can be measured.

Next, a fourth embodiment of the present invention will be described.

Figure 6:
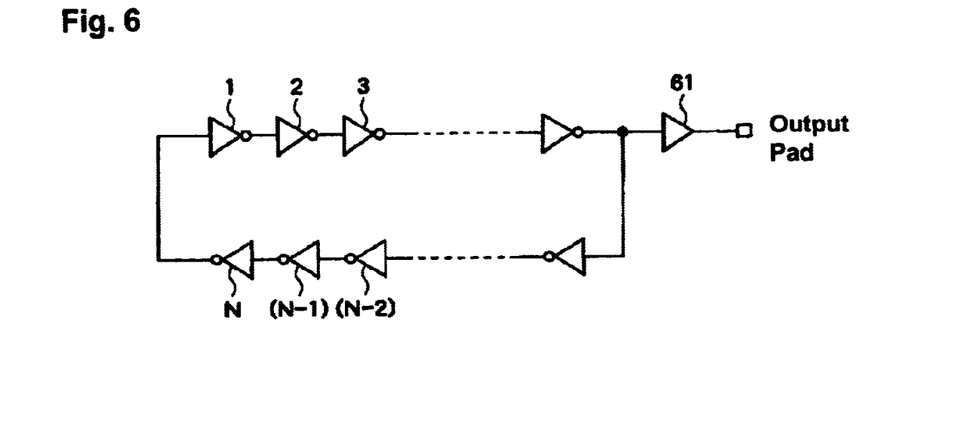
FIG. 6 is a circuit diagram of a test circuit that is formed in a scribe TEG region for a semiconductor device in accordance with a fourth embodiment of the present invention.

FIG. 6 is a circuit diagram of a test circuit that is formed in the scribe TEG region for a semiconductor device in accordance with the fourth embodiment of the present invention. In the present embodiment, inverter circuits 1–N similar to those of the first embodiment are connected in a loop to form a ring oscillator for examination. An oscillation signal is taken out from one point on the loop to the output pad through a buffer circuit 61.

In AC examination of a semiconductor wafer, a probe that is connected to a measuring apparatus is brought into contact with the output pad, and a necessary power supply voltage is supplied to a power supply pad. Then, a frequency or a cycle of an oscillation signal appearing on the output pad is measured. For example, if the frequency of the measured oscillation signal is 100 MHz, the cycle of the oscillation signal is 10 nanoseconds. Where the stage number N of the inverter circuits is 99, the following expression is established where each stage has a delay time of α.

99α=10 nanosecond/2

Accordingly, for the delay time α at each stage, α=about 50 picoseconds. In AC examination of the wafer, pass or fail judgment of the wafer can be made based on the oscillation frequency and oscillation cycle of the examination ring oscillator, or the delay time of each stage.

Next, a fifth embodiment of the present invention will be described.

Figure 7:
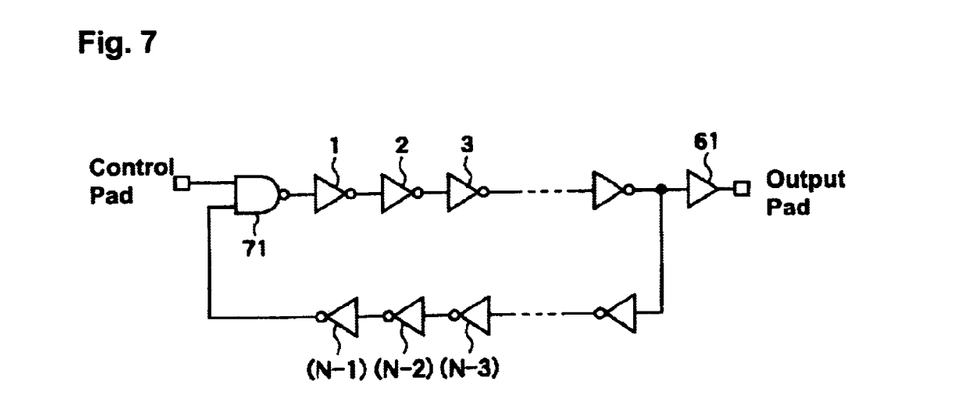
FIG. 7 is a circuit diagram of a test circuit that is formed in a scribe TEG region for a semiconductor device in accordance with a fifth embodiment of the present invention.

FIG. 7 is a circuit diagram of a test circuit that is formed in the scribe TEG region for a semiconductor device in accordance with the fifth embodiment of the present invention. In the present embodiment, one of the plurality of inverter circuits that form the examination ring oscillator in the fourth embodiment is replaced with a NAND circuit 71. A control signal is supplied through the control pad to one of the inputs of the NAND circuit 71. In this manner, by using the NAND circuit 71 in a part of the ring oscillator, the oscillation operation can be controlled to turn on and off by using a control signal.

When the control signal is at a low level, the output of the NAND circuit 71 always remains at a high level, and the ring oscillator does not perform an oscillation operation. On the other hand, when the control signal changes to be a high level, the signal applied to the other input of the NAND circuit 71 is inverted and outputted, such that the ring oscillator starts its oscillation operation. The oscillation signal is supplied through the buffer circuit 61 to the output pad, and in a similar manner as in the fourth embodiment, the oscillation frequency and oscillation cycle of the examination ring oscillator, or the delay time of each stage, can be measured.

As described above, with the present invention, at an initial stage, a determination can be made as to whether a wafer is acceptable or defective in the case of DC examinations for circuit elements and also AC examinations for circuit delay times and the like. Also, by forming the same circuit for different types, data can be compared among the different types. Further, the AC examination in each chip may possibly be omitted, which alleviates the burden for analysis in the AC examination.

What is claimed is:

1. A semiconductor device, comprising:
    a semiconductor wafer including a plurality of chip regions in which a specified circuit is formed, and a scribe region to divide the plurality of chip regions;
    a test circuit for wafer examination formed in the scribe region and formed of a plurality of transistors;
    an output pad formed in the scribe region and connected to the test circuit; and
    an input pad formed in the scribe region and connected to the test circuit, the test circuit including a plurality of serially connected inversion circuits.

2. The semiconductor device according to claim 1, the plurality of transistors formed in the scribe region for wafer examination being uniformly configured with respect to the specified circuit.

3. The semiconductor device according to claim 1, the plurality of transistors formed in the scribe region for wafer examination forming a cell having a configuration of a basic cell formed in the chip regions.

4. A semiconductor device, comprising:
a semiconductor wafer including a plurality of chip regions in which a specified circuit is formed, and a scribe region to divide the plurality of chip regions;
a test circuit for wafer examination formed in the scribe region and formed of a plurality of transistors:
an output pad formed in the scribe region and connected to the test circuit; and
an input pad formed in the scribe reagon and connected to the test circuit,
the test circuit including a selector circuit that supplies a signal supplied from the input pad to at least one of a first output and a second output according to a control signal, a plurality of inverter circuits serially connected to a first output of the selector circuit, and an output circuit that supplies to the output pad one of an output signal of the last stage of the plurality of inverter circuits and a second output signal of the selector circuit, and
the semiconductor device further including a control pad formed in the scribe region to input a control signal to the selector circuit.

5. A semiconductor device, comprising:
a semiconductor wafer including a plurality of chip regions in which a specified circuit is formed, and a scribe region to divide the plurality of chip regions;
a test circuit for wafer examination formed in the scribe region and formed of a plurality of transistors;
an output pad formed in the scribe region and connected to the test circuit; and
an input pad formed in the scribe region and connected to the test circuit, the test circuit including a plurality of inverter circuits serially connected to the input pad, and an output circuit that produces an exclusive OR of an output signal of the last stage of the plurality of inverter circuits and an input signal supplied to the input pad and supplies one of the output signal and the input signal to the output pad.

6. A semiconductor device, comprising:
a semiconductor wafer including a plurality of chip regions in which a specified circuit is formed, and a scribe region to divide the plurality of chip regions;
a test circuit for wafer examination formed in the scribe region and formed of a plurality of transistors;
an output pad formed in the scribe region and connected to the test circuit, the test circuit including a plurality of circuits that are connected in a loop, invert an input signal and output the inverted input signal, and an output circuit that supplies an output signal of one of the plurality of circuits to the output pad.

7. The semiconductor device according to claim 6, the plurality of circuits including at least one NAND circuit, and the semiconductor device further including a control pad that is formed in the scribe region to supply a control signal to one of inputs of the at least one NAND circuit.

* * * * *